(12) United States Patent
Menezes et al.

(10) Patent No.: US 6,342,307 B1
(45) Date of Patent: *Jan. 29, 2002

(54) EMBEDDED CLUSTER METAL-POLYMERIC MICRO INTERFACE AND PROCESS FOR PRODUCING THE SAME

(75) Inventors: Marlon E. Menezes, Santa Clara, CA (US); Howard K. Birnbaum; Ian M. Robertson, both of Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 08/976,670

(22) Filed: Nov. 24, 1997

(51) Int. Cl.[7] .............................. B32B 15/08; B32B 5/16
(52) U.S. Cl. ...................... 428/561; 428/559; 428/612; 428/626; 428/458
(58) Field of Search .............................. 428/458, 626, 428/612, 559, 561, 323, 675

(56) References Cited

U.S. PATENT DOCUMENTS

| | | | |
|---|---|---|---|
| 3,736,170 A | | 5/1973 | Lo et al. |
| 4,720,401 A | | 1/1988 | Ho et al. |
| 4,975,327 A | | 12/1990 | Somasiri et al. |
| 5,137,791 A | * | 8/1992 | Swisher ...................... 428/612 |
| 5,151,304 A | | 9/1992 | Lee |
| 5,183,692 A | | 2/1993 | Mukerji et al. |
| 5,480,730 A | * | 1/1996 | Swisher ...................... 428/612 |
| 5,631,498 A | * | 5/1997 | Anschel et al. ............. 257/690 |

OTHER PUBLICATIONS

R.F. Saraf, J.M. Roldan and T. Derderian, "Tailoring the Surface Morphology of Polyimide for Improved Adhesion", *IBM Journal of Research and Development*, vol. 38, No. 4, Jul. 4, 1994, pp. 441–455.

N.L.D. Somasiri, R.L.D. Zenner and J.C. Houge, "A Process for Surface Texturing of Kapton Polyimide to Improve Adhesion to Metals", *IEEE Transactions of Components, Hybrids and Manufacturing Technology*, vol. 14, No. 4, Dec. 1991, pp. 789–801.

R.M. Tromp, F. Legoues and P.S. Ho, "Interdiffusion at the Polyimide–Cu Interface", *Journal of Vacuum Science and Technology*, vol. A3, No. 3, May/Jun. 1985, pp. 782–785.

W.R. Tyson, "Surface Energies of Solid Metals", *Canadian Metallurgical Quarterly*, vol. 14, No. 4, 1975, pp. 307–314 (No Month).

Souheng Wu, "Surface and Interfacial Tensions of Polymers, Oligomers, Plasticizers and Organic Pigments, *Polymer Handbook*", J. Brandrup and E.H. Immergut (eds.) 3rd Edition, John Wiley and Sons, New York, 1989, pp. V1/411–V1434. (No Month).

(List continued on next page.)

*Primary Examiner*—John J. Zimmerman
(74) *Attorney, Agent, or Firm*—Greer, Burns & Crain, Ltd.

(57) ABSTRACT

A micro interface between a polymeric layer and a metal layer includes isolated clusters of metal partially embedded in the polymeric layer. The exposed portion of the clusters is smaller than embedded portions, so that a cross section, taken parallel to the interface, of an exposed portion of an individual cluster is smaller than a cross section, taken parallel to the interface, of an embedded portion of the individual cluster. At least half, but not all of the height of a preferred spherical cluster is embedded. The metal layer is completed by a continuous layer of metal bonded to the exposed portions of the discontinuous clusters. The micro interface is formed by heating a polymeric layer to a temperature, near its glass transition temperature, sufficient to allow penetration of the layer by metal clusters, after isolated clusters have been deposited on the layer at lower temperatures. The layer is recooled after embedding, and a continuous metal layer is deposited upon the polymeric layer to bond with the discontinuous metal clusters.

11 Claims, 4 Drawing Sheets

OTHER PUBLICATIONS

Frederick Fowkes, "Attractive Forces at Interfaces", *Industrial and Engineering Chemistry*, vol. 56, No. 12, Dec. 1964, pp. 40–52.

G.J. Kovacs and P.S. Vincett, "Formation and Thermodynamic Stability of a Novel Class of Useful Materials: Close–Packed 90, Monolayers of Submicron Monodisperse Spheres Just Below a Polymer Surface", *Journal of Colloid and Interface Science*, vol. No. 2, Dec. 2, 1982, pp. 335–351.

M.E. Menezes, I.M. Robertson and H.K. Birnbaum, "Technique to Measure Thermodynamic Adhesion of Copper–Polyimide Interfaces", *Electronics Packaging Materials Science*, vol. 445, Materials Research Society, 1996. (No Month).

M.E. Menezes, I.M. Robertson and H.K. Birnbaum, "Novel Technique to Improve Adhesion Between Metal–Polymer Interfaces", *Electronics Packing Materials Science*, vol. 445, Materials Research Society, 1996. (No Month).

M. Menezes, I.M. Robertson and H.K. Birnbaum, "Measurement and Improvement of the Adhesion of Copper To Polyimide", *Journal of Materials Research*, Mar. 27, 1998.

The content of the papers entitled "Technique to Measure Thermo–Dynamic Adhesion of Copper–Polyimide Interfaces" and "Novel Technique to Improve Adhesion Between Metal–Polymer Interfaces" was disclosed at a conference conducted on Dec. 2–5, 1996.

* cited by examiner

EMBEDDED CLUSTER METAL-POLYMERIC MICRO INTERFACE AND PROCESS FOR PRODUCING THE SAME

This invention was made with Government assistance pursuant to grant number 1-5-27114 awarded by the Department of Energy. The Government has certain rights in this invention.

FIELD OF THE INVENTION

The present invention is in the microelectronics field and generally concerns a micro interface having improved adhesion between metal and polymeric layers which have weak intrinsic bonding characteristics. More specifically, the present invention concerns a micro interface in which isolated microscopic metal clusters are partially embedded in a polymeric layer to form a mechanically based bond upon which a continuous metal layer can be adhered by bonding to exposed portions of the isolated microscopic metal clusters.

BACKGROUND OF THE INVENTION

For many years, the microelectronics industry has utilized relatively poor conductors, primarily aluminum, for metal contacts and interconnections in integrated circuits. Other metals, such as copper and silver, have superior electrical characteristics, but bond poorly with the polymeric materials used to form many microelectronic devices. Compared to aluminum, copper has superior electromigration resistance, which permits higher current loads on a sustained basis. In addition, copper has lower electrical resistance, providing many potential advantages including reduced power consumption, reduced operational temperature, smaller feature sizes, and greater levels of miniaturization. Use of copper could improve the speed and power, and reduce the size of microelectronic devices.

Notwithstanding the many known advantages of copper and similar metals compared to aluminum, aluminum has been used because of its good intrinsic bonding to commonly used microelectronic materials. Poor bonding between contact metal and polymeric material can lead to premature device failure and manufacturing difficulties. During fabrication and operation, thermal stresses generated due to thermal mismatch between the metal and polymeric layers may be sufficient to cause delamination within the structure absent sufficient adhesion between the metal and polymeric layers. As a result, metals such as copper, which form weak chemical and thermodynamic bonds with commonly used microelectronic circuit materials, have been largely avoided despite their superior electrical performance characteristics.

Particular materials to which copper and similar metals bond poorly are organic polymers, such as polyimides and other types of plastics and polyesters. Polyimides are commonly used as an interlayer dielectric in microelectronic devices, and are also commonly used for encapsulation. Such polymeric materials are favored for these applications since they are low cost, easy to handle, and offer numerous desirable properties. These properties include flexibility, good planarization, and thermal stability. The organic polymers may also be mechanically and chemically tailored to match the needs of a particular application. In addition, they admit of multiple processing methods commonly used to fabricate microelectronic devices, including plasma etching, reactive ion etching, and laser ablation.

Polyimides offer further advantages in microelectronic devices including a high glass transition temperature, permitting a wide range of fabrication temperatures, and low dielectric constants. Combined with the good thermal stability, these advantages allow the polyimides to withstand common fabrication processes, such as metal deposition, annealing, and soldering.

Aluminum and similar metals adhere well to polyimide layers because they form relatively strong chemical bonds to the atomic constituents of the polyimides, i.e. carbon, oxygen, nitrogen, and hydrogen. In contrast, copper and similar metals form weak chemical bonds with those atomic constituents. As a result, a conventional copper-polyimide interface has poor adhesion due to the limited chemical interaction across the interface.

A number of techniques have been used to increase metal-polymer adhesion. These techniques fall into three general categories: chemical, mechanical and combined. The prior adhesion enhancement techniques have, to varying degrees, achieved enhanced adhesion. However, each has some associated difficulties and disadvantages.

The typically used chemical adhesion enhancement is known as wet chemistry. Wet chemistry adds functional groups, such as carbonyls, to the polymer that can chemically react with deposited metal. One potential drawback of wet chemistry is the usual need to perform several steps: activation of the polymer surface, removal of residue, and post metalization heat treatments. The method might also result in an undesirable deep modification of the polymer surface in the micrometer range, which can adversely affect the properties of polymer thin films.

Known mechanical adhesion enhancements involve texturing of the polymer surface to increase surface roughness and surface area. Various methods are known to produce the surface roughness and surface area. Though these are referred to as mechanical enhancements because of the roughness phenomena, the actual bond is still based upon the relatively weak chemical interaction between the metal and polymer. Thus, the mechanical modification describes the polymer surface, as opposed to the actual manner of bonding. Gains in adhesion per unit area result from the increased interface surface per unit area produced by the texturing.

Prior combined adhesion enhancements include plasma etching and base treatment. In plasma etching, energetic ions, electrons, photons and highly reactive neutrals are made to interact with the polymer surface. Chemical changes result from bond breaking and preferential sputtering at the polymer surface. Reactive neutrals present in the plasma also lead to the incorporation of chemically active groups that can chemically bond with the polymer. In base treatment of polyimides, the surface of the polymer is treated with a base, such as KOH or NaOH, to convert the polyimide surface to a polyamate. Subsequent treatment with an acid transforms the polyamate surface to a polyamic acid. The polyamic surface is then partially cured to form an amorphous polyimide/polyamic acid surface which bonds better with a subsequent metal layer. Apart from complexity, these combined adhesion techniques may result in excessive etch or conversion, which then actually impedes adhesion.

Accordingly it is an object of the present invention to provide an improved metal layer to polymeric layer micro interface which overcomes the aforementioned difficulties and disadvantages.

An additional object of the present invention is to provide an improved micro interface which achieves a true mechanical interlocking between a metal and a polymeric layer.

A further object of the present invention is to provide an improved micro interface for providing mechanical adhesion between metal and polymeric layers through partially embedded discontinuous metal clusters in the polymeric layer which form a bonding base for a continuous metal layer to be formed upon.

Another object of the present invention is to provide an improved process for forming a micro interface between a metal layer and a polymeric layer including steps of depositing isolated microscopic metal clusters on a polymeric layer, heating the polymeric layer to a temperature near its glass transition temperature to cause the metal clusters to partially embed into the surface of the polymeric layer in isolated fashion, and then forming a continuous layer of metal at a lower temperature.

SUMMARY OF THE INVENTION

The micro interface of the present invention provides true mechanical bonding between a metal layer and a polymeric layer. The mechanical bonding results in a good adhesion strength between metal and polymeric layers which have poor intrinsic chemical and thermodynamic bonding, such as between copper and polyimides. According to the invention, discontinuous isolated metal clusters are mechanically trapped within the surface of the polymeric layer, with a portion of the metal clusters being exposed. The metal layer is completed by a continuous metal layer, which bonds to the exposed metal clusters. This strong bond supplements the weak intrinsic bonding between the metal and polymeric layers.

More particularly, the present interface between a polymeric layer and a metal layer includes isolated discontinuous microscopic clusters of metal partially embedded in the polymeric layer. The exposed portion of the clusters is smaller than embedded portions, so that a cross section, taken parallel to the interface, of an exposed portion of an individual cluster is smaller than a cross section, taken parallel to the interface, of an embedded portion of the individual cluster. Preferably, at least half, but not all of the height of a cluster is embedded. The metal layer is completed by a continuous layer of metal bonded to the exposed portions of the discontinuous clusters.

The micro interface of the present invention is formed by heating a polymeric layer for a specific time-temperature relationship sufficient to allow penetration of the layer by metal clusters. The discontinuous metal clusters are first deposited onto a surface of the polymeric layer while the polymeric layer is cool so that the metal clusters form in isolated fashion on the polymeric layer surface. Then the polymeric layer is heated to a temperature near its glass transition temperature for a time sufficient to partially embed the metal clusters into the polymeric layer. After cooling, a continuous metal layer is deposited upon the polymeric layer to bond with the partially embedded discontinuous metal clusters.

BRIEF DESCRIPTION OF THE DRAWINGS

Other features, objects, and advantages of the invention will be apparent by reference to the detailed description and the drawings, of which.

DETAILED DESCRIPTION OF THE INVENTION

Figure 1A:
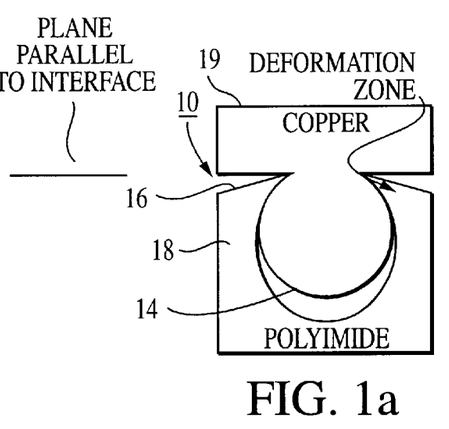
FIG. 1(a) is a schematic cross sectional view of the embedded micro interface according to the present invention.

The present invention concerns an improved micro interface 10, shown in FIG. 1(a), for metal and polymeric materials that form weak intrinsic chemical and thermodynamic bonds. Unlike previous mechanically based micro interfaces 12, like that shown in FIG. 1(b), a true mechanical interlock is obtained at the microscopic level in the micro interface 10 of the present invention. In the present micro interface 10, partially embedded metal clusters 14 are trapped by the surface 16 of a polymeric layer 18. A continuous metal layer 19 is formed upon the surface, and bonds to exposed portions of the partially embedded metal clusters 14. Good adhesion between otherwise weakly bonding materials occurs because, in essence, the surface 16 of the polymeric layer 18 would have to be ripped apart for delamination to occur.

The conditions defining partially embedded require that an embedded cross section of a cluster 14 at at least one plane parallel to the interface 10 and below the surface 16 is larger than an exposed cross section taken at or immediately below the surface 16 in a plane parallel to the interface 10. In the illustrated embodiment, the partially embedded clusters are copper and are generally spherical in shape. The conditions for partially embedding therefore require that greater than half the height but less than the whole height of the sphere be embedded to achieve the micro mechanical interlocking of the interface of the invention.

Figure 1B:
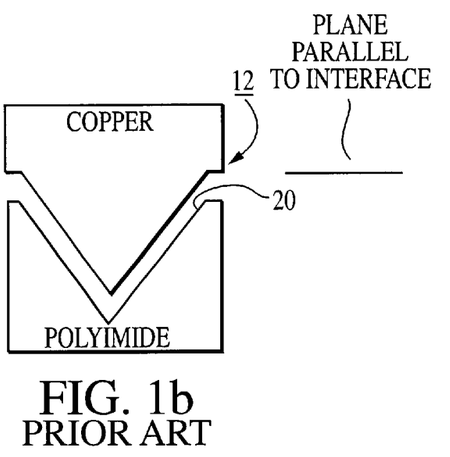
FIG. 1(b) is a schematic cross section of a prior art mechanical adhesion enhancement.

The same effect is not present in the prior art surface roughening bond illustrated in FIG. 1(b). There, as will be apparent to artisans, the primary basis for improved adhesion is the increased surface area provided by the roughened surface 20 of the polymeric layer. In FIG. 1(b), delamination may occur by merely overcoming the chemical and thermodynamic bonds since there is no mechanical impediment to delamination at the interface 12.

The method for forming the micro interface 10 shown in FIG. 1(a) involves the heating of a polymeric layer having isolated metal clusters deposited thereon to produce the embedding. Subsequently, the layer is cooled and then a continuous metal layer is formed which bonds with the isolated metal clusters, and, to some extent through weak intrinsic bonding, to the exposed portions of the polymeric surface.

Any polymeric layer can be employed using the method of this invention, including organic and nonorganic polymers. Preferably, the polymeric layer used in this invention has a polymer chain. Examples of polymeric layers having a polymer chain that can be used include MYLAR (a trademark of E.I. duPont de Nemours, Inc.), polyimides, polyesters, plastics, and thermoplastic polymers. As used herein "thermoplastic polymer" means any polymer that softens when exposed to heat and returns to its original condition when cooled to room temperature. Examples of thermoplastic polymers are polystyrene, polyethylene, polypropylene, tetrafluoroethylene, and fluorocarbon polymers (such as Teflon®, which is available from duPont). The data reported herein concerns samples having a polyimide layer, specifically PMDA-ODA or BPDA-PDA.

Any metal which can form clusters to partially embed may be used to produce the interface according to the present invention, but the interfaces which will benefit most greatly will be those including metals that do not exhibit strong chemical interactions with polymeric layers. Metals which can be deposited with good adhesion in accordance with this invention include copper (Cu), silver (Ag), gold (Au), palladium (Pd), and platinum (Pt), all of which otherwise exhibit poor intrinsic chemical and thermodynamic bonding with polymeric layers.

Prior to depositing the metal clusters 14 on the polymeric layer 18, the layer 18 may be annealed to desorb water. It was found that a period of time from about 10 to about 20 minutes at a temperature of from about 650 K to about 700 K was sufficient to accomplish the evaporation for particular polyimide materials used to demonstrate the invention.

After annealing, the polymeric layer 18 is heated to a temperature well below its glass transition temperature ($T_g$) so that discontinuous metal clusters may be deposited on the surface 16 of the layer 18. Taking into account the duration of metal cluster deposition and the properties of the polymeric layer, the temperature should be low enough to avoid significant diffusion between the clusters 14 and the polymeric layer 18. A broad temperature range is possible for the deposition of discontinuous metal clusters, from room temperature or less to about 50% of the glass transition temperature for the polymeric layer. Conditions are chosen to avoid the thermodynamically favored state of complete embedding of the metal clusters. Oxidation of the clusters must also be avoided, requiring that the discontinuous metal deposition of isolated clusters and the subsequent anneal to produce embedding be done under vacuum conditions or in an inert environment.

For example, if the layer is a polyimide, it may be heated to a temperature of from about 323 K to about 410 K. The layer is maintained at this temperature throughout the deposition of the discontinuous layer of isolated metal clusters. Once the layer is heated, a discontinuous layer of metal is deposited on the polyimide layer. The metal may be deposited on to the polyimide layer by sputtering, electron-beam evaporation, chemical vapor deposition, or similar techniques. Process conditions must also avoid rates and durations which lead to continuous metal formation.

For the copper-polyimide micro interface samples produced to demonstrate the invention, metal atoms were deposited on the polyimide layer at a rate of about one monolayer per minute. One monolayer per minute corresponds to approximately 0.005 nanometers per second (nm/s). The metal atoms were deposited on the polyimide layer at rates of about 0.005 nm/s to about 0.015 nm/s, most often at the rate of about 0.01 nm/s, at a temperature of 398K. These rates were sufficiently slow to allow for mobility of the metal (copper) atoms, and the temperature was low enough to prevent diffusion of copper atoms into the polymer. Several monolayers of metal (~5–20 nm) are deposited on the polymer layer, making sure that continuous metal film does not form on the polymer layer surface.

As the metal is deposited, isolated clusters of metal atoms are formed on the surface of the polymer layer. As used herein, the term "cluster" means a number of things of the same kind that are grown or gathered together. These clusters of metal atoms form a discontinuous layer that is eventually used to anchor the polyimide layer to a subsequently formed continuous metal layer.

Because of the high surface energy of the metal relative to the polyimide layer, the metal clusters exhibit an embedding force on the polyimide layer. Nonetheless, the metal clusters do not diffuse into the polyimide layer as a result of the polyimide layer being held to a temperature well below its glass transition temperature.

Subsequent to the deposition of discontinuous isolated metal clusters onto the polymer layer surface, conditions are created to partially embed the isolated clusters into the polymer layer surface. The embedding effect depends upon the characteristics of the materials used to form the micro interface and the duration and temperature of the embedding step. Specifically, the viscosity of the polymer layer, the cluster size, the temperature used for embedding, and the duration of the embedding step control the embedding effect. Generally, the embedding step temperature should approach the glass transition temperature, e.g. greater than about 80% of the glass transition temperature and less than a temperature which materially affects the properties of the polymeric layer. However, the time of embedding and the temperature of embedding are inversely related, so that lower temperatures will require greater times to produce embedding and higher temperatures require lesser times for embedding.

For copper-PMDA-ODA samples, partial embedding was achieved by annealing at 673 K for about 15 minutes. At that temperature, anneals longer than 15 minutes resulted in complete embedding, which is undesirable since no metal is exposed which could be used to bond a continuous metal layer. As discussed above, the time at which the partial embedding effect will be lost will depend upon the anneal temperature, as well as the metal cluster size and specific type of polymeric layer. The partially embedded metal clusters function as "nano-nails", and anchor the subsequent continuous metal overlayer to the underlying polyimide layer. The vacuum conditions, or low oxygen partial pressures, ensure minimal concentrations of oxygen that can lead to oxidation. Suitable vacuum conditions are at or below about $10^{-7}$ torr.

After the heating is completed, recooling is conducted to a temperature from about room temperature to about 50% of the glass transition temperature for the polymer layer. For the samples produced to demonstrate the invention, a continuous layer of copper was deposited after cooling to room temperature at several monolayers per minute. Since a continuous layer is the goal here, deposition may occur at a much faster rate than was used to form the isolated clusters. Specific rates used for the produced samples were between about 0.1 nm/s and 0.2 nm/s.

Polyimide layers for the sample interfaces produced were fabricated from duPont Pyralin 2545™ (for PMDA-ODA) or duPont Pyralin 2611™ (for BPDA-ODA) by spinning the polyamic precursor onto either silicon wafers or polished stainless steel stubs. The former were used for transmission electron microscopy characterization studies and the latter for mechanical property tests. After spin coating, the polyamic acid was baked in a flowing nitrogen atmosphere to evaporate the solvents and to cure the final polyimide film. The cure schedule used to obtain the final product was 2 to 5 minutes at 373 K, followed by ramped heating to 523 K for approximately 3 hours. Prior to copper deposition, the substrate was annealed in the vacuum chamber for 15 minutes at 673 K, as mentioned above, to evaporate absorbed water and to promote the final cure.

Insight into the thermodynamic and kinetic properties of the metal cluster formation on the polyimide layer can be gained using several mathematical formulas. For example, the thermodynamic adhesive strength, $W_a$, of the interface between the metal and the polyimide layer can be determined from the following formula:

$$W_a = \gamma_1 + \gamma_2 - \gamma_{21} \tag{1}$$

where, $\gamma_1$ and $\gamma_2$ are the surface energies of the metal and polyimide layer, respectively, and $\gamma_{21}$ is the interfacial energy of the metal-polymide layer junction. For copper $\gamma_1 = 1650$ mJ m$^{-2}$ and for PMDA-ODA $\gamma_2 = 38$ mJ m$^{-2}$.

The interfacial energy can be estimated using Fowkes' theory for nonchemically interacting interfaces and is represented by the following formula:

$$\gamma_{21} = \gamma_1 + \gamma_2 - 2(\gamma_1{}^d \gamma_2{}^d)^{1/2} \tag{2}$$

where the superscript "d" refers to the dispersion or Van Dear Waals components of the respective surface energies. For copper and PMDA-ODA, $\gamma_1{}^d$ and $\gamma_2{}^d$ are respectively 60 mJ m$^{-2}$ and 29 mJ m$^{-2}$. Thus, $\gamma_{21} = 1604$ mJ m$^{-2}$.

Figure 2:
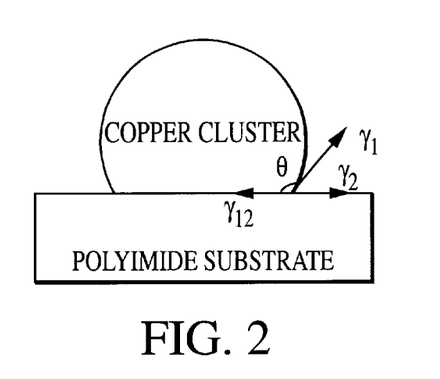
FIG. 2 is a diagram illustrating contact angle calculations.

The contact angle can be calculated using the following formula:

$$z/2r = 0.5(1 - \cos\theta) \tag{3}$$

where "z" and "r" are respectively the height and radius of the metal cluster. The components of the equations are represented graphically in FIG. 2. The contact angle predicted according to the equations for PMDA-ODA is 162°. Partial embedding of spherical clusters is expected when $\gamma_{21}$ is less than $\gamma_1$, and complete embedding when $\gamma_1$ is greater than the sum $\gamma_{21} + \gamma_2$.

Figure 3:
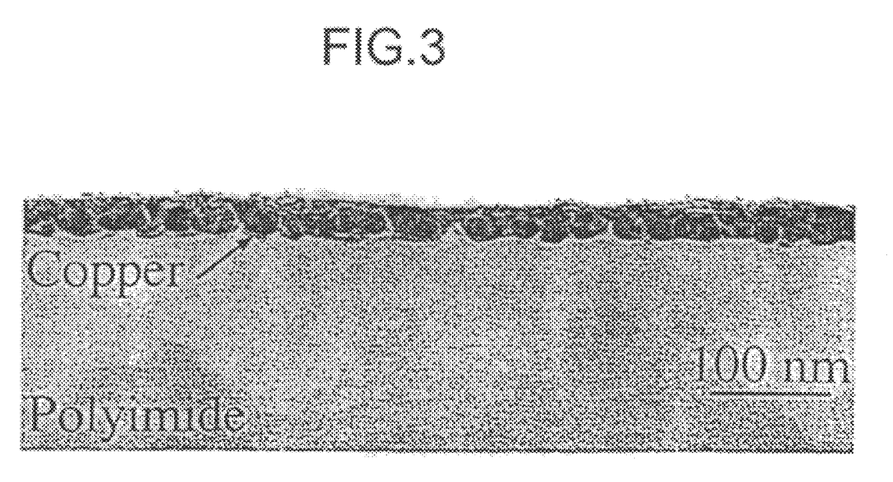
FIG. 3 is a TEM cross section of a sample micro interface according to the invention.

Samples were also characterized through transmission electron microscopy TEM and through mechanical adhesion testing. For cross-sectional TEM, sample preparation was based on techniques developed by Peddeda in Peddeda, R., *Preparation and Characterization of Metal/Sapphire and Metal/Polyimide Thin-Film Laminates*, Ph.D. Thesis, (Department of Material Science and Engineering, University of Illinois, 1991). This involved sandwiching together two SiO coated copper-polyimide-silicon polyimide layers with their SiO surfaces in contact. A five minute room temperature epoxy was used to glue the two surfaces. The couple was then pressed in a vice to ensure complete contact and a thin epoxy layer between the metal layers. The glued sandwich was cut perpendicular to the interface into thin sections (500–800 microns) using a diamond saw. These specimens were then mechanically thinned in a direction perpendicular to the interface to about 30 microns using a Dimpler™. The dimpled samples were then mounted onto molybdenum washers that were 3 mm in diameter, with a 1 mm diameter hole in the center. Final thinning to electron transparency was done by ion milling using a Gatan dual gun ion miller that was operated at 5 kV with beam currents of 0.05 mA per gun. Beam angles of 15 to 16 degrees were used for most of the thinning. The last 10 minutes of milling was done at an angle of about 14 degrees in order to reduce any uneven topography that may have formed as a result of preferential sputtering. The samples were analyzed in a Philips CM-12 microscope operated at 120 kV. A resultant image is presented in FIG. 3, in which partially embedded copper clusters are visible which connect to the continuous metal overlayer.

Contact angles for copper clusters interfaced with both BPDA-PDA and PMDA-ODA samples were measured. To conduct contact angle measurements, the partial embedding step is skipped since the angle is measured with the copper clusters on the polymer surface. Between two and five imaging conditions involving variations in tilt and magnification were utilized for each particle, and each particle was measured three times per imaging condition. The following table summarizes measured contact angles, with the number of particles analyzed given in parenthesis. Respective deposition temperatures were 323 K for PMDA-ODA and 348 K for BPDA-PDA.

TABLE 1

|  | 2 nm | 3 nm | 3.5 nm |
|---|---|---|---|
| BPDA-PDA | 135 ± 7° (15) | 127 ± 6° (11) | 121 ± 10° (8) |
| PMDA-ODA |  |  | 120 ± 7° (9) |

Using the 120°, 127° and 135° values in the above equations yields respective calculated work of adhesions values of 825, 657, and 483 mJ m$^{-2}$. The relatively high contact angles which illustrates poor wetting between copper and the polymimides is indicative of poor thermodynamic adhesion at this interface.

Figure 4:
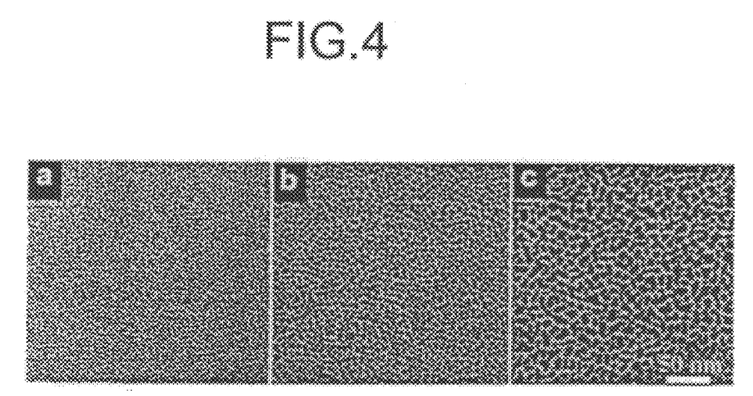
FIGS. 4(a)–4(c) are plan view TEM images of different thickness discontinuous layers.

The effect of the deposition conditions (polyimide layer temperature, deposition rate and average layer thickness) on the sphericity of the clusters was also studied by varying the deposition temperature and the average thickness of the layer. FIG. 4 shows plan view TEM images of films of average thickness of 1(a), 2(b) and 4(c) nm, which were deposited at a rate of 0.005 nm s$^{-1}$ and at a polyimide layer temperature of 323 K. Clearly, with increasing layer thickness, the deviation from sphericity increases. This deviation is a consequence of impingement of neighboring clusters. For the same layer thickness, the deviation from sphericity increases with decreasing temperature.

Figure 5:
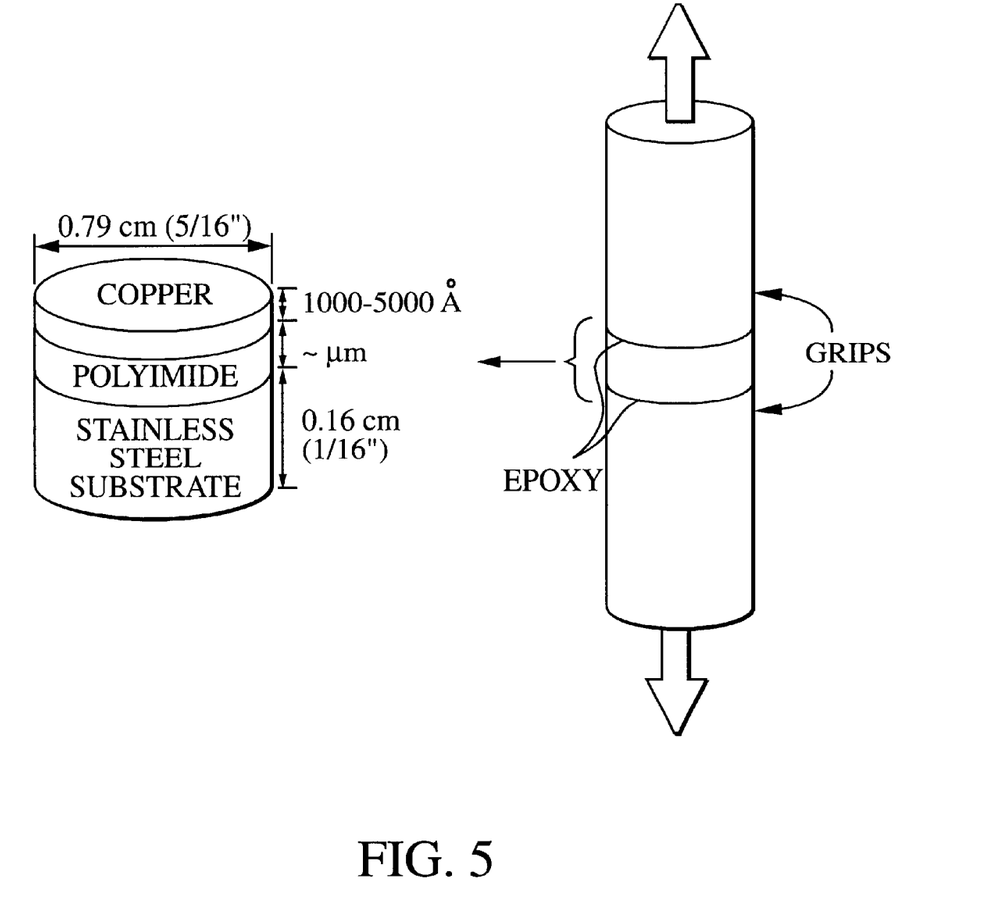
FIGS. 5(a) and 5(b) illustrate the adhesion test configuration used to test samples according to the invention and prior art.

For the adhesion testing, the configuration shown in FIG. 5 was adopted. The copper/polyimide/stainless steel stubs were attached to stainless steel grips using a 60 minute 3M Scotch Weld™ 1838 L B/A epoxy. The same testing configuration was used for samples with and without the embedded clusters. The samples were then tested in unliaxial tension at a ramp rate of 5×10$^{-6}$ m s$^{-1}$.

Figure 6:
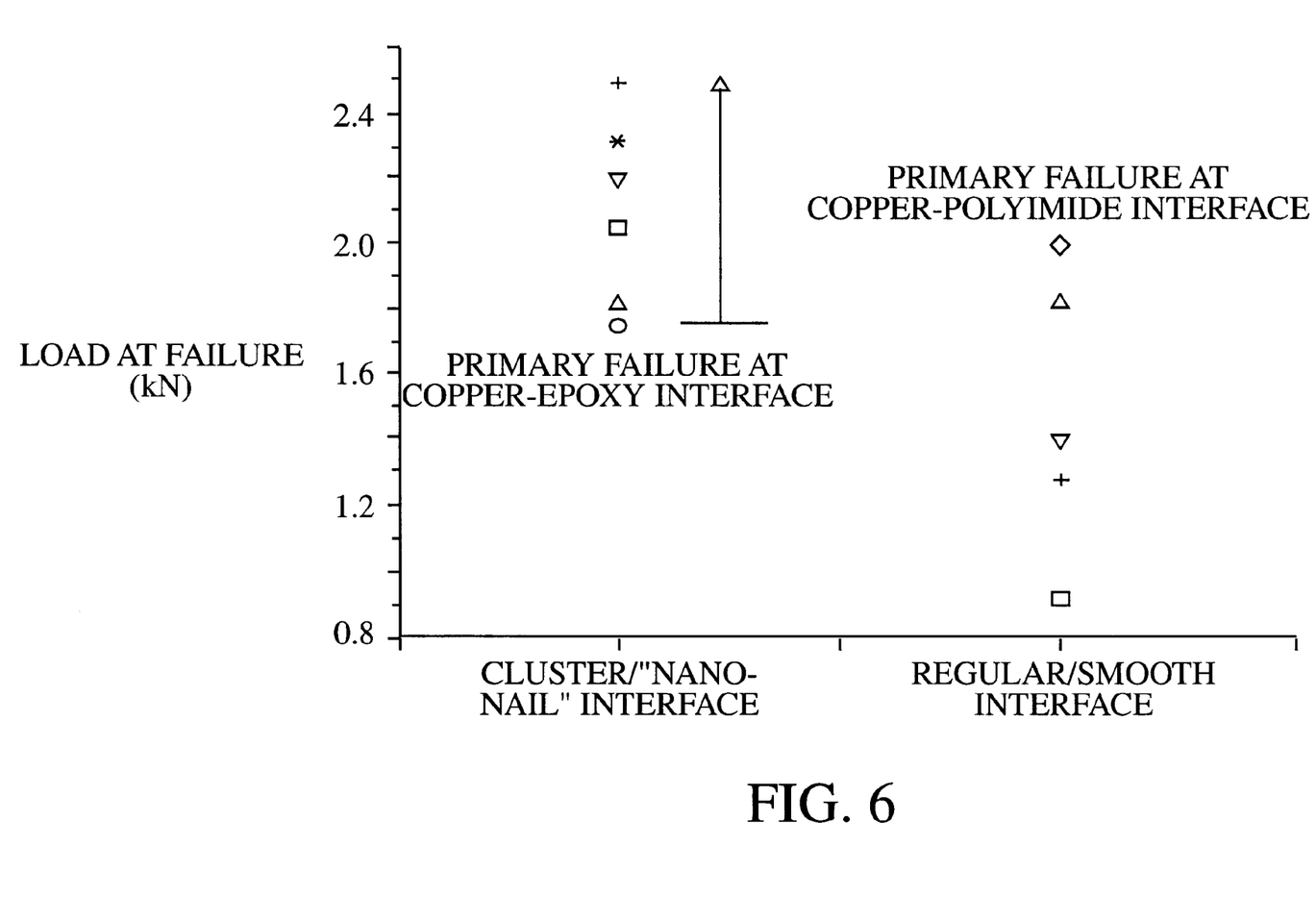
FIG. 6 is a graph showing results obtained from adhesion tests on invention and prior art samples.

FIG. 6 shows the results of tensile tests for a number of samples for the partially embedded and nonembedded sample types. The nonembedded prior art samples tested were unaided by wet chemistry or surface roughening, e.g., the prior art samples tested were "smooth" interfaces. The load at failure for the samples containing no embedded clusters is considerably lower than that for the samples with embedded clusters. The difference in the failure load of the copper-polyimide interface is even larger than indicated in the FIG. 6, since the embedded cluster samples did not fail at the copper-polyamide interfaces. Instead, the samples failed at the copper-epoxy-stainless steel grip interface. In contrast, the samples with no embedded clusters always failed at the copper-polyimide interface.

The prior art interfaces failed at an average strength of 2.82 kNcm$^{-2}$, with a maximum value of 4.08 kNcm$^{-2}$ and a minimum value of 1.63 kNcm$^{-2}$. None of the micro interfaces of the invention failed, only the testing package, yielding a lower bound of 3.55 kNcm$^{-2}$ for the testing package. The average data of package failure indicated that the present embedded cluster micro interface samples had strengths in excess of 5.10 kNcm$^{-2}$, the largest value at which a test package failed. Reading the data together, it is reasonable to conclude that the present embedded cluster micro interface yields an improvement of a factor exceeding about four compared to conventional interfaces.

The invention is not limited to the described embodiments. Various modifications and applications will be apparent to those skilled in the art. Accordingly, the scope of the invention is to be determined by the appended claims and legal equivalents thereto.

What is claimed is:

1. A micro interface between a polymeric layer and a metal layer for providing mechanical adhesion between the polymeric layer and the metal layer, said micro interface being formed by portions of the polymeric layer and the metal layer and consisting essentially of:

isolated clusters of metal atoms gathered together, the isolated clusters being partially embedded in but not diffused into the polymeric layer to mechanically interlock so that a cross section, taken parallel to the micro interface, of an exposed portion of an individual cluster is smaller than a cross section, taken parallel to the micro interface, of an embedded portion of the individual cluster, said isolated clusters forming a portion of the metal layer; and a continuous layer of metal bonded to said exposed portions of said isolated clusters, said continuous layer of metal completing the metal layer.

2. The micro interface according to claim 1, wherein said isolated clusters are generally spherical in shape.

3. The micro interface according to claim 2, wherein more than half the height of an individual cluster but less than the whole height of the individual cluster is embedded into the polymeric layer.

4. The micro interface according to claim 1, wherein more than half the height of an individual cluster but less than the whole height of the individual cluster is embedded into the polymeric layer.

5. The micro interface according to claim 4, wherein the metal layer is formed from the group of metals consisting of copper, silver, gold, palladium, and platinum.

6. The micro interface according to claim 5, wherein the polymeric layer is formed from an organic polymer.

7. The micro interface according to claim 6, wherein the polymeric layer is formed from a polyimide.

8. The micro interface according to claim 1, wherein the metal layer is formed from the group of metals consisting of copper, silver, gold, palladium, and platinum.

9. The micro interface according to claim 8, wherein the polymeric layer is formed from an organic polymer.

10. The micro interface according to claim 9, wherein the polymeric layer is formed from a polyimide.

11. The micro interface according to claim 9, wherein the adhesive strength of the interface exceeds about 4.08 $kNcm^{-2}$.

* * * * *